US012622199B2

(12) United States Patent

Kotsugai et al.

(10) Patent No.: US 12,622,199 B2

(45) Date of Patent: May 5, 2026

(54) GAS PURGE UNIT AND THE LOAD PORT DEVICE

(71) Applicant: TDK CORPORATION, Tokyo (JP)

(72) Inventors: Tatsuhiro Kotsugai, Tokyo (JP); Jun Emoto, Tokyo (JP); Takuya Kudo, Tokyo (JP)

(73) Assignee: TDK Corporation, Tokyo (JP)

( * ) Notice: Subject to any disclaimer, the term of this patent is extended or adjusted under 35 U.S.C. 154(b) by 510 days.

(21) Appl. No.: 18/030,576

(22) PCT Filed: Oct. 8, 2021

(86) PCT No.: PCT/JP2021/037448

§ 371 (c)(1),
(2) Date: Apr. 6, 2023

(87) PCT Pub. No.: WO2022/075468

PCT Pub. Date: Apr. 14, 2022

(65) Prior Publication Data

US 2023/0420272 A1    Dec. 28, 2023

(30) Foreign Application Priority Data

Oct. 8, 2020    (JP) ................................. 2020-170479

(51) Int. Cl.
H10P 72/00    (2026.01)
H10P 72/10    (2026.01)
H10P 72/30    (2026.01)

(52) U.S. Cl.
CPC ...... H10P 72/0402 (2026.01); H10P 72/3408 (2026.01)

(58) Field of Classification Search
CPC .................................................. H10P 72/0402
See application file for complete search history.

(56) References Cited

U.S. PATENT DOCUMENTS

| | | | | |
|---|---|---|---|---|
| 2015/0000789 A1* | 1/2015 | Otsuka | .............. | H01L 21/67769 |
| | | | | 141/369 |
| 2017/0140965 A1* | 5/2017 | Ogawa | .............. | H01L 21/67393 |
| 2017/0170043 A1 | 6/2017 | Oh et al. | | |

(Continued)

FOREIGN PATENT DOCUMENTS

| | | |
|---|---|---|
| JP | 2015-035612 A | 2/2015 |
| JP | 2017-092429 A | 5/2017 |
| JP | 2017-139486 A | 8/2017 |

(Continued)

OTHER PUBLICATIONS

KR20160014170 and translation (Year: 2016).*

(Continued)

*Primary Examiner* — Steven S Anderson, II

(74) *Attorney, Agent, or Firm* — Oliff PLC

(57)    ABSTRACT

A gas purge unit including: a first purge nozzle in which a gas flow path is internally formed, which communicates with a first purge port at the bottom of a container, and which introduces gas into the container or discharges gas from the container; a first communication unit which has a first holding unit for holding the first purge nozzle at one end; and a first actuator to which the first communication unit is connected and which moves the first communication unit and the first purge nozzle vertically.

10 Claims, 9 Drawing Sheets

(56)                References Cited

U.S. PATENT DOCUMENTS

2020/0201363 A1 *   6/2020   Hruzek  ................ G05D 7/0652

FOREIGN PATENT DOCUMENTS

JP           2017-220561 A       12/2017
KR           10-1593386 B1       2/2016
KR           20160014170 A   *   2/2016   ....... H01L 21/68771

OTHER PUBLICATIONS

Mar. 28, 2023 International Preliminary Report on Patentability issued in International Patent Application No. PCT/JP2021/037448.

* cited by examiner

GAS PURGE UNIT AND THE LOAD PORT DEVICE

TECHNICAL FIELD

The present invention relates to a gas purge unit for introducing gas into a container or discharging gas from the container and a load port device including the gas purge unit.

BACKGROUND

A gas purge unit is proposed for increasing the cleanliness of a container containing silicon wafers and other substrates in a semiconductor factory or the like. As a gas purge unit, there is proposed one in which a purge nozzle communicating with a purge port formed in the bottom of a container moves vertically like a piston with respect to a mounting table (see Patent Document 1, etc.).

For example, a conventional gas purge unit discloses a nozzle vertical movement mechanism for adjusting the pressure of a closed space surrounded by a flange of a cylindrical nozzle disposed inside a cylindrical holder, an outer circumferential surface of the nozzle, an inner circumferential surface of a cylinder, and a bottom wall of the cylinder.

In the conventional gas purge unit, however, it is necessary to disassemble a nozzle peripheral mechanism at the time of repair or failure of the vertical movement mechanism, which poses a problem in terms of maintainability.

PRIOR ARTS

Patent Document

Patent Document 1: JP2017139486 (A)

SUMMARY OF INVENTION

Problems to be Solved by Invention

The present invention has been achieved under such circumstances and provides a gas purge unit, etc. having a nozzle vertical movement mechanism with excellent maintainability.

Means for Solving the Problem

To achieve the above object, a gas purge unit according to the present invention comprises:

a first purge nozzle including a gas passage formed therein and being capable of communicating with a first purge port provided at a bottom of a container so as to introduce gas into the container or discharge gas from the container;

a first connection portion including a first holding portion for holding the first purge nozzle at one end of the first connection portion; and a first actuator connected with the first connection portion so as to vertically move the first connection portion and the first purge nozzle.

In the gas purge unit according to the present invention, since the first purge nozzle and the first actuator are connected by the first connection portion, the first purge nozzle and the first actuator are separated. In such a gas purge unit, it is not necessary to disassemble the nozzle at the time of repair or failure of the first actuator, and maintainability is excellent.

Moreover, for example, the gas purge unit according to the present invention may further comprise a second purge nozzle including a gas passage formed therein and being capable of communicating with a second purge port provided at the bottom of the container so as to introduce gas into the container or discharge gas from the container, wherein the first connection portion may comprise:

a second holding portion for holding the second purge nozzle at the other end of the second holding portion; and an arm portion for connecting the first holding portion and the second holding portion, the first connection portion may be connected to the first actuator via the arm portion, and the first actuator vertically may move the first connection portion, the first purge nozzle, and the second purge nozzle.

In such a gas purge unit, since two purge nozzles are operated by one actuator, the operations of the two purge nozzles can be easily synchronized, and it is possible to prevent a connection failure between the purge nozzles and the purge ports. Moreover, since the two purge nozzles are operated by one first actuator, the number of parts can be reduced, and assemblability and maintainability are excellent in this respect as well.

Moreover, for example, the gas purge unit according to the present invention may comprise a common gas passage for supplying gas to both of the first purge nozzle and the second purge nozzle or for receiving gas discharged from both of the first purge nozzle and the second purge nozzle, wherein both of the first purge nozzle and the second purge nozzle may introduce gas to the container or discharge gas from the container.

Since such a gas purge unit includes the common gas passage for gas introduction or gas discharge, the gas passage is simplified, and maintainability is excellent. In addition, since the total length of the gas passages included in the entire gas purge unit can be reduced, the number of parts can be reduced, and assemblability and maintainability are improved. In addition, since gas can be introduced or discharged by a plurality of nozzles, gas can be efficiently purged in the container.

Moreover, for example, a branching portion with a branching passage from the common gas passage to the first purge nozzle and the second purge nozzle may be disposed closer to the first actuator than the first and second purge nozzles.

When the branching portion is disposed near the first actuator in the horizontal direction, the difference between the passage length from the common gas passage to the first purge nozzle and the passage length from the common gas passage to the second purge nozzle is reduced, and gas can be introduced into the container from the two nozzles in a well-balanced manner or discharged from the container. In addition, when the branching portion is disposed near the first actuator in the horizontal direction and the vertical direction, it is possible to reduce the total length of the passage from the common gas passage to the first purge nozzle and the passage from the common gas passage to the second purge nozzle. When the passage length is reduced, the improvement in pressure transmissibility, the reduction in the amount of gas leakage, and the like are expected.

Moreover, for example, the gas purge unit according to the present invention may comprise a flexible tube portion including a gas passage formed therein and connected to a lower end of the first purge nozzle, wherein the flexible tube portion may deform according to a vertical movement of the first purge nozzle.

When the gas purge unit according to the present invention includes such a flexible tube portion, the passage can be connected to the first purge nozzle vertically movable with a simple structure.

Moreover, for example, the gas purge unit according to the present invention may further comprise:

a third purge nozzle including a gas passage formed therein and being capable of communicating with a third purge port provided at the bottom of the container so as to introduce gas into the container or discharge gas from the container;

a second connection portion including a third holding portion for holding the third purge nozzle at one end of the second connection portion; and a second actuator connected with the second connection portion and vertically moving the second connection portion and the third purge nozzle.

In such a gas purge unit, the third purge nozzle can be operated independently of the first purge nozzle using the second actuator.

Moreover, for example, the first purge nozzle vertically movable by the first actuator may introduce gas into the container, and the third purge nozzle vertically movable by the second actuator may discharge gas from the container.

In such a gas purge unit, since the first purge nozzle for introducing gas and the third purge nozzle for discharging gas can operate independently, when performing only gas introduction or gas discharge, unused purge ports at this time can be closed.

A load port device according to the present invention comprises:

any one of the above-mentioned gas purge units; and a mounting table capable of mounting the container and provided with the gas purge unit, wherein a first guide ring, through which the first purge nozzle is inserted, is detachably fixed to the mounting table, and a notch portion for restricting a rise of a stepped surface formed on an outer circumferential wall of the first purge nozzle is formed at a lower inner periphery of the first guide ring.

In such a load port device, the first purge nozzle can be moved by the first guide ring with high positional accuracy. Since a stopper is formed by the notch portion and the stepped surface, the tilting of the purge nozzle in its raised position is prevented, and a favorable vertical movement can be achieved. Moreover, since the first guide ring is detachable, assemblability and maintainability are excellent.

DETAILED DESCRIPTION OF INVENTION

Hereinafter, the present invention is described based on an embodiment shown in the figures.

Figure 1:
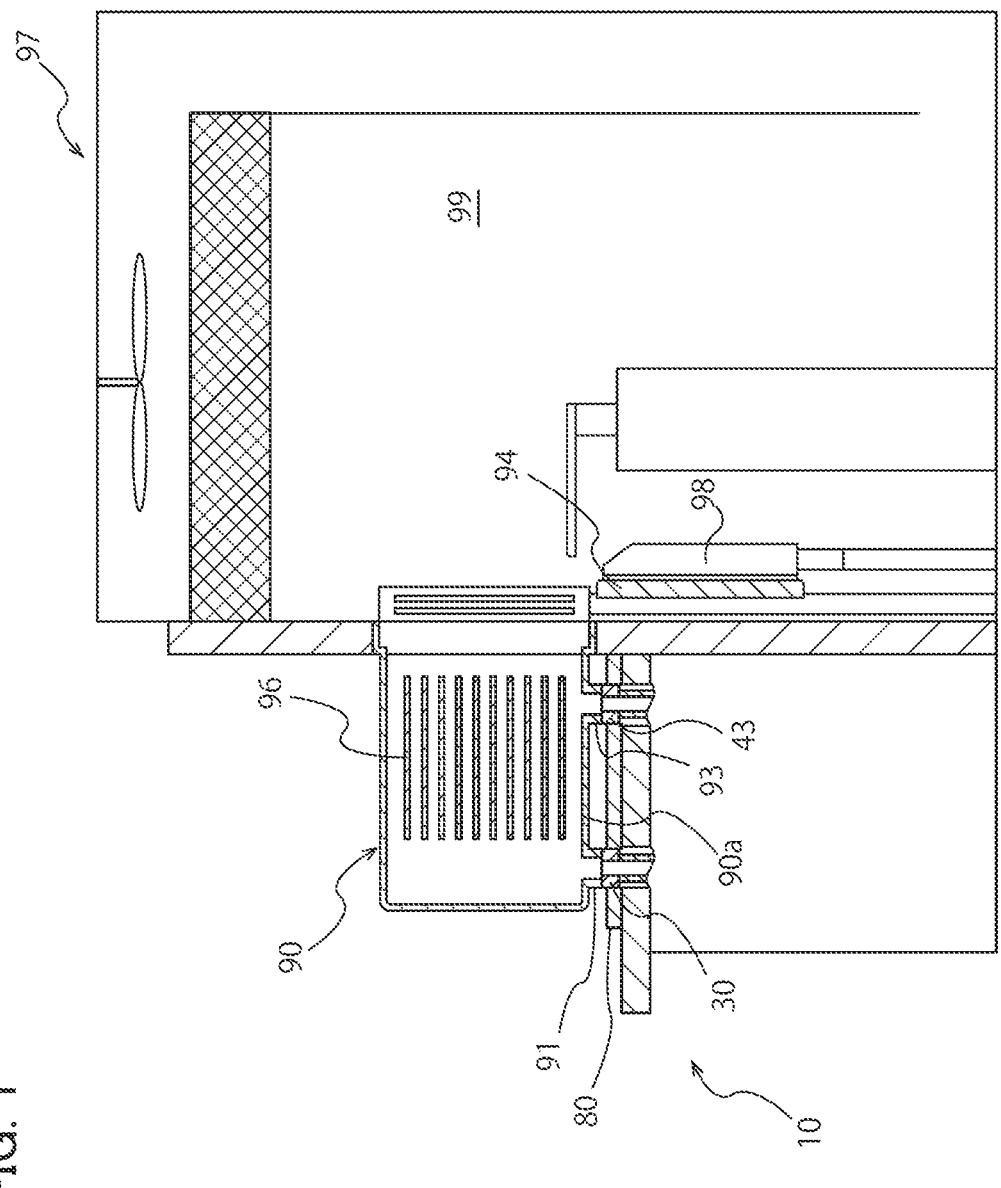
FIG. 1 is a schematic cross-sectional view of a load port device including a gas purge unit according to an embodiment of the present invention and its peripheral equipment.

FIG. 1 is a schematic view of an EFEM 97 provided with a load port device 10 including a gas purge unit 20 (see FIG. 3) according to an embodiment of the present invention and a container 90 mounted on the load port device 10.

The load port device 10 shown in FIG. 1 constitutes a part of the EFEM 97. A transfer robot or the like for transferring a substrate 96 is disposed in a substrate transfer chamber 99 of the EFEM 97 connected with the load port device 10. The transfer robot takes out the substrate 96, such as a silicon wafer, stored in the container 90 from the container 90 connected to the substrate transfer chamber 99 by the load port device 10 and transfers the substrate 96 to a load lock chamber, a semiconductor processing device, or the like.

The container 90 is a container used when transporting the substrate 96 to be processed to each device in a semiconductor factory and is, for example, a FOUP. The container 90 can contain a plurality of substrates 96 and includes a shelf (not illustrated) for arranging the substrates 96 in alignment and a lid 94 for closing a main opening for taking in and out the substrates 96. The load port device 10 includes a door 98 for opening or closing the lid 94 of the container 90 and can remove the lid 94 from the main body portion of the container 90.

As shown in FIG. 1, a bottom portion 90a of the container 90 is provided with a first purge port 91 and a third purge port 93. As described below, a first purge nozzle 30 and a third purge nozzle 43 of the load port device 10 communicate with a first purge port 91 and a third purge port 93 of the container 90 and can introduce a cleaning gas into the container 90. Although not shown in FIG. 1, as with the first and third purge ports 91 and 93, the bottom portion 90a of the container 90 is also provided with a second purge port communicating with a second purge nozzle 42 (see FIG. 3) and a fourth purge port communicating with a fourth purge nozzle 44 (see FIG. 3).

Figure 2:
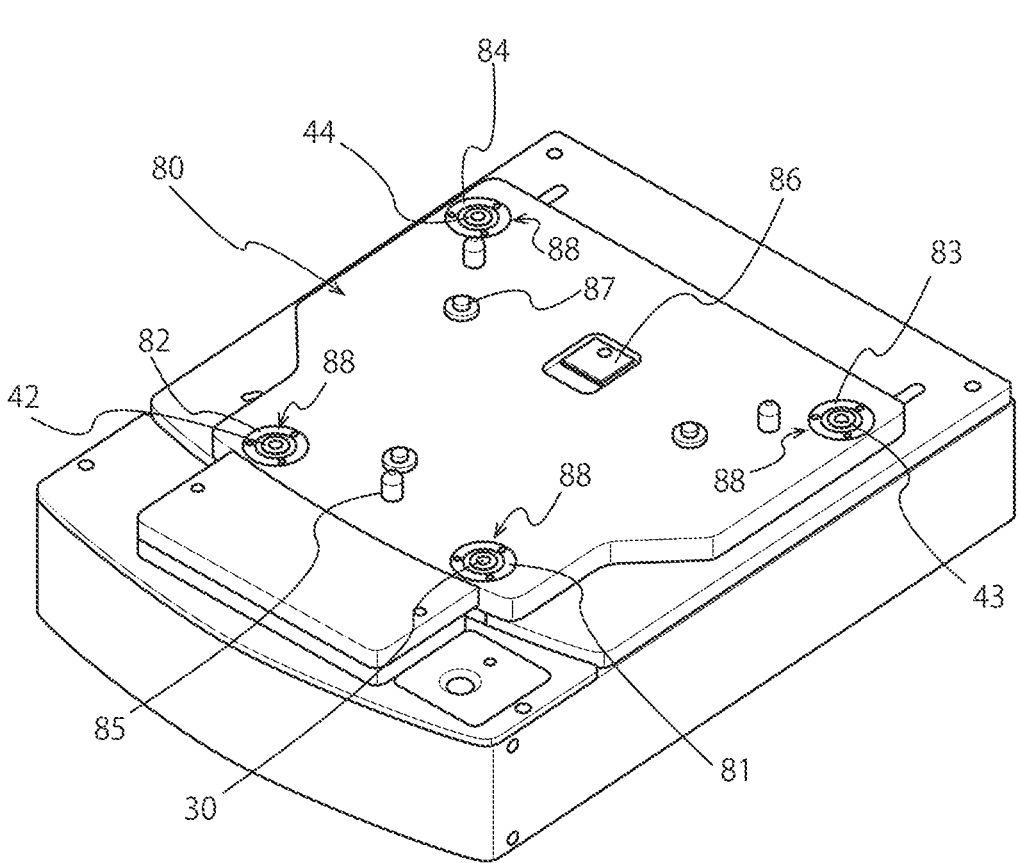
FIG. 2 is a schematic perspective view of a mounting table and the gas purge unit of the load port device shown in FIG. 1 as viewed diagonally from above.

FIG. 2 is a schematic perspective view of the periphery of a mounting table 80 of the load port device 10 as viewed diagonally from above. As shown in FIG. 2, the load port device 10 includes the mounting table 80 capable of mounting the container 90 for containing the substrates 96. The mounting table 80 is provided with a positioning pin 85 for positioning the container 90 with respect to the mounting table 80, a fixation mechanism 86 for fixing the container 90 to the mounting table 80, a mounting sensor 87 for detecting the mounting of the container 90, and the like.

Figure 3:
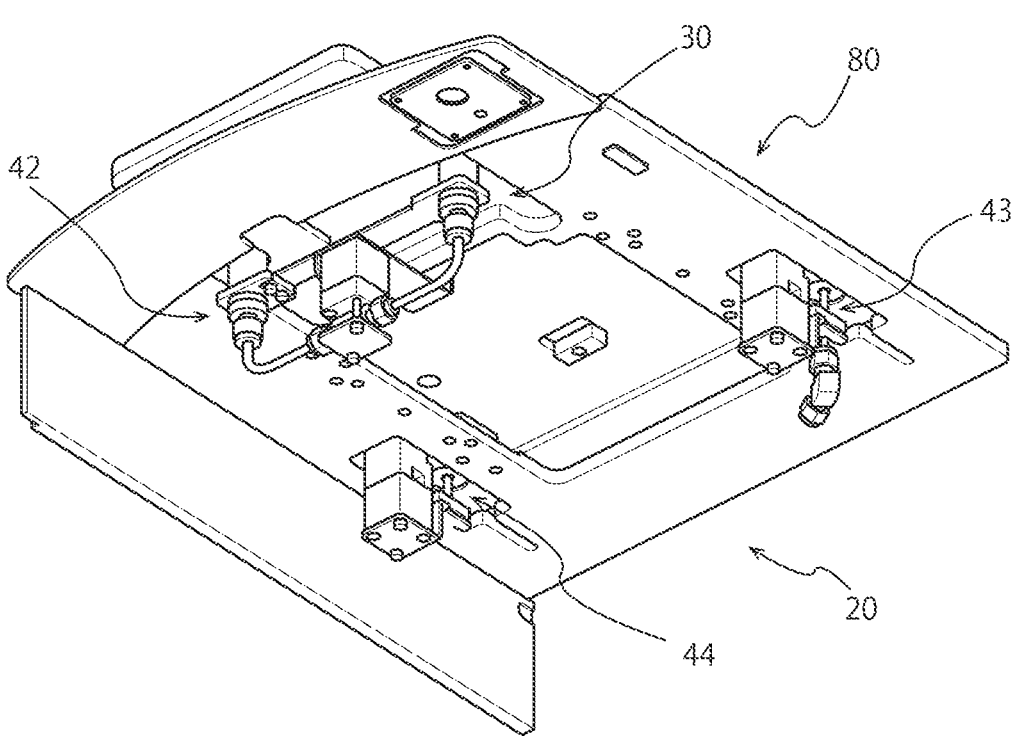
FIG. 3 is a schematic perspective view of a mounting table and the gas purge unit of the load port device shown in FIG. 1 as viewed diagonally from below.

As shown in FIG. 3, which is a schematic perspective view of the mounting table 80 as viewed diagonally from below, the mounting table 80 is provided with the gas purge unit 20. The gas purge unit 20 includes four purge nozzles of the first purge nozzle 30, the second purge nozzle 42, the third purge nozzle 43, and the fourth purge nozzle 44. However, the number of purge nozzles included in the gas purge unit 20 is not limited to only four. The gas purge unit 20 may include one to three purge nozzles or may include five or more purge nozzles.

As shown in FIG. 2, the mounting table 80 is formed with through holes 88 through which the first purge nozzle 30, the second purge nozzle 42, the third purge nozzle 43, and the fourth purge nozzle 44 are inserted. The through holes 88 are provided with first to fourth guide rings 81 to 84, respectively, so as to correspond with the first to fourth purge nozzles 30, 42, 43, and 44. The first to fourth purge nozzles 30, 42, 43, and 44 are inserted into the through holes 88 and are exposed above the mounting table 80.

As shown in FIG. 3, the first to fourth purge nozzles 30, 42, 43, and 44 are provided downward from near the upper surface of the mounting table 80. As described below, actuators for vertically moving the first to fourth purge nozzles 30, 42, 43, and 44, pipes connecting to the first to fourth purge nozzles 30, 42, 43, and 44, and the like (not illustrated) are arranged on the lower side of the mounting table 80.

Figure 4:
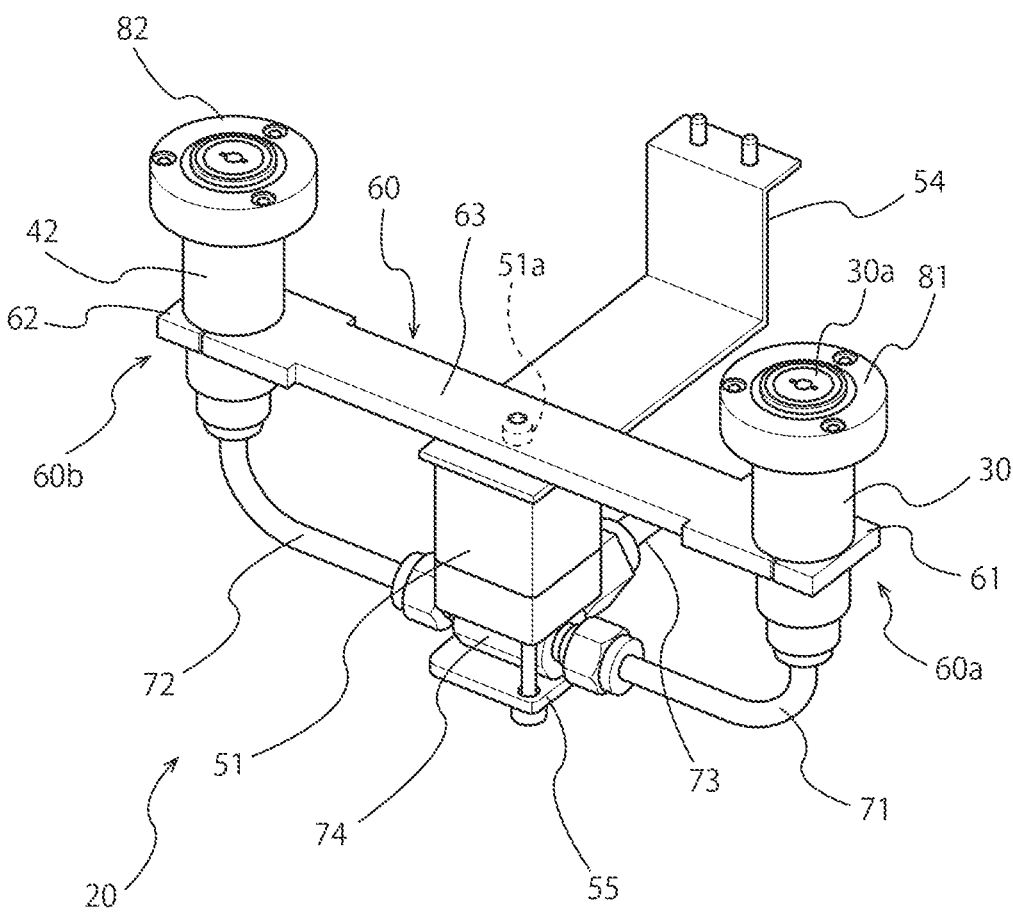
FIG. 4 is a main-part perspective view illustrating a state in which first and second purge nozzles shown in FIG. 3 are in their lowered positions.

FIG. 4 is a main-part perspective view of the gas purge unit 20 shown in FIG. 3 in a state in which the first and second purge nozzles 30 and 42 are in their lowered positions. The first purge nozzle 30 and the second purge nozzle 42 shown in FIG. 4 communicate with the first purge port 91 and the second purge port of the container 90, respectively, so as to introduce gas into the container 90. Unlike this, either one or both of the first purge nozzle 30 and the second purge nozzle 42 may discharge gas from the container 90.

Figure 8:
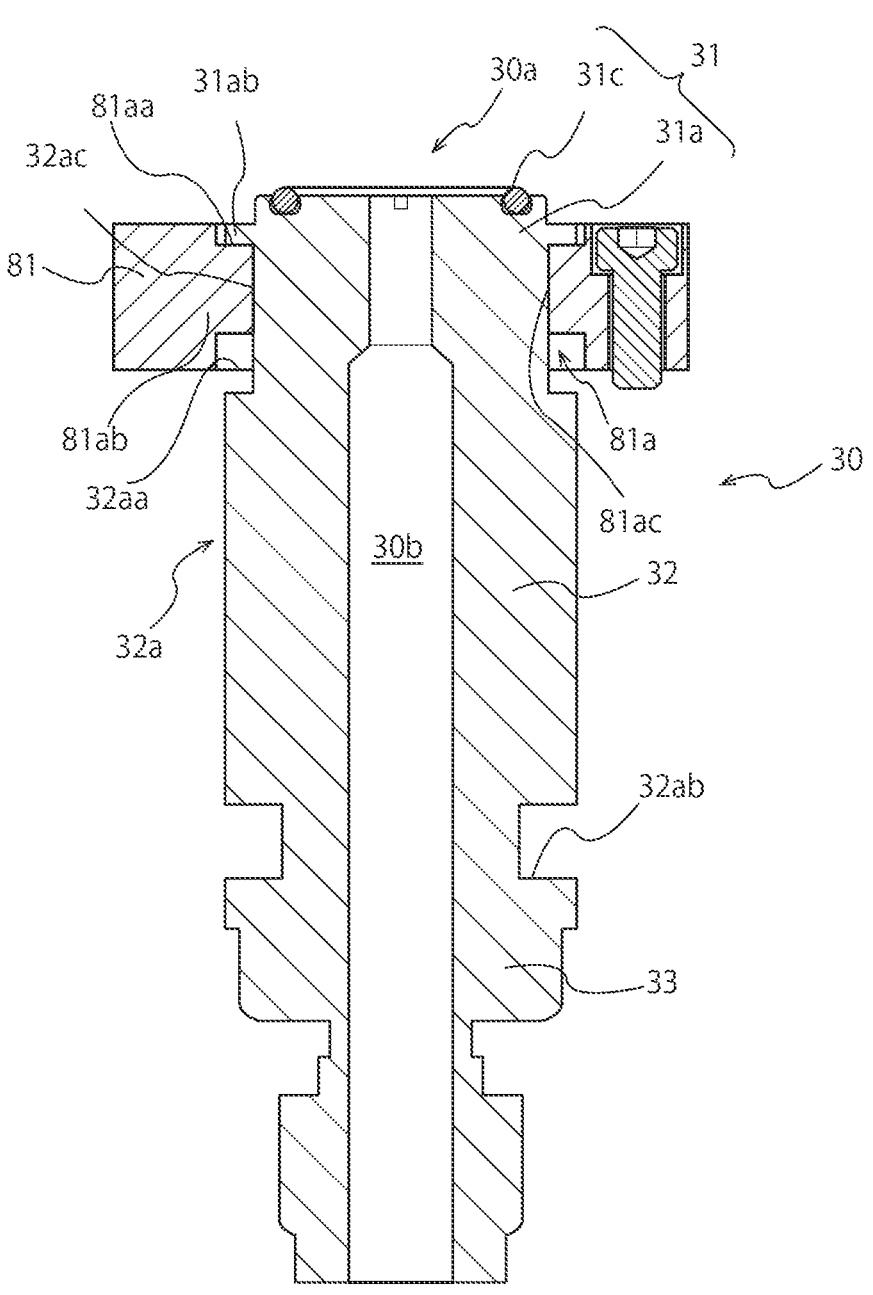
FIG. 8 is a schematic cross-sectional view illustrating the first purge nozzle in its lowered position and a first guide ring.

FIG. 8 is a schematic cross-sectional view illustrating the first purge nozzle 30 in its lowered position and the first guide ring 81. The first purge nozzle 30 is formed by a first section 31, a second section 32, and a third section 33. A gas passage 30b is formed inside the first purge nozzle 30. As with the first purge nozzle 30 shown in FIG. 8, the second to fourth purge nozzles 42 to 44 are also formed with gas passages formed therein.

As shown in FIG. 4, the gas purge unit 20 includes a first connection portion a first actuator 51, a bracket 54, a support portion 55, a common gas passage 73, a branching portion 74, a first flexible tube portion 71, a second flexible tube portion 72, and the like. The first actuator 51 is fixed to the mounting table 80 shown in FIG. 3 via the bracket 54.

The first actuator 51 includes a drive shaft 51a that moves vertically. The first actuator 51 is not limited as long as it vertically moves the first connection portion 60, the first purge nozzle 30, the second purge nozzle 42, and the like via the drive shaft 51a and the like. For example, the first actuator 51 is a linear motor, a combination of a rotary motor and a gear or cam mechanism, an air cylinder, an electromagnetic solenoid, or the like.

In the first actuator 51, the transmission means for transmitting a driving force to the first connection portion 60 is not limited to only the mode in which the first connection portion 60 is directly connected to the drive shaft 51a of the first actuator 51 as shown in FIG. 4. For example, the first actuator 51 may be connected to the first connection portion 60 via a link mechanism, a cam mechanism, a drive belt, or the like.

As shown in FIG. 4, the first connection portion 60 includes a first holding portion 61, a second holding portion 62, and an arm portion 63. The first holding portion 61 is provided at one end 60a of the first connection portion 60 and holds the first purge nozzle 30. The first holding portion 61 includes a ring portion that can be opened or closed. The first purge nozzle 30 is fixed to the first holding portion 61 by engaging the ring structure of the first holding portion 61 with a communication groove 32ab (see FIG. 8) formed in an outer circumferential wall 32a of the second section 32.

The second holding portion 62 is provided at the other end 60b of the first connection portion 60 opposite to one end 60a and holds the second purge nozzle 42. As with the first holding portion 61, the second holding portion 62 also includes a ring portion that can be opened or closed and holds the second purge nozzle 42 with the same mechanism as the first holding portion 61.

The arm portion 63 connects the first holding portion 61 and the second holding portion 62 in a substantially horizontal direction. The first connection portion 60 is connected to the first actuator 51 at substantially the center of the arm portion 63. Thus, the first actuator 51 vertically moves the first connection portion 60, the first purge nozzle 30, and the second purge nozzle 42.

The connection structure between the first and second purge nozzles 30 and 42 and the first actuator 51 is not limited to only one using the first connection portion 60 including the arm portion 63 as shown in FIG. 4. For example, the first purge nozzle 30 and the second purge nozzle 42 may be connected to the first actuator 51 via different connection portions and may further be connected to respective actuators.

As shown in FIG. 4, the gas purge unit 20 includes the common gas passage 73 for supplying gas to both of the first purge nozzle 30 and the second purge nozzle 42. Gas flows into the common gas passage 73 from a gas supply section (not illustrated), and the passage branches from the branching portion 74 of the common gas passage 73 to the first purge nozzle 30 and the second purge nozzle 42.

As shown in FIG. 4, the branching portion 74 having a branching passage from the common gas passage 73 to the first purge nozzle 30 and the second purge nozzle 42 is closer to the first actuator 51 than the first and second purge nozzles 30 and 42. The support portion 55 for supporting the branching portion 74 from below is connected to the bottom of the first actuator 51. Thus, these members are fixed to the mounting table via the bracket 54. Since the branching portion 74 is disposed near the first actuator 51, the branching portion 74 is positioned near the center of the first purge nozzle 30 and the second purge nozzle 42 located on both sides in the horizontal direction. Thus, the passage lengths from the branching portion 74 to the purge nozzles 30 and 42 can be the same. In addition, since the branching portion 74 is disposed near the first actuator 51 in the vertical direction, the passage length from the branching portion 74 to each of the purge nozzles 30 and 42 can be reduced. This is advantageous in terms of gas pressure propagation speed and leak prevention.

The gas purge unit 20 includes the first flexible tube portion 71 that connects the branching portion 74 and the first purge nozzle 30 and the second flexible tube portion 72 that connects the branching portion 74 and the second purge nozzle 42. A gas passage is formed inside the first flexible tube portion 71, and the gas branched at the branching portion 74 flows into the first purge nozzle 30 via the first flexible tube portion 71.

Figure 5:
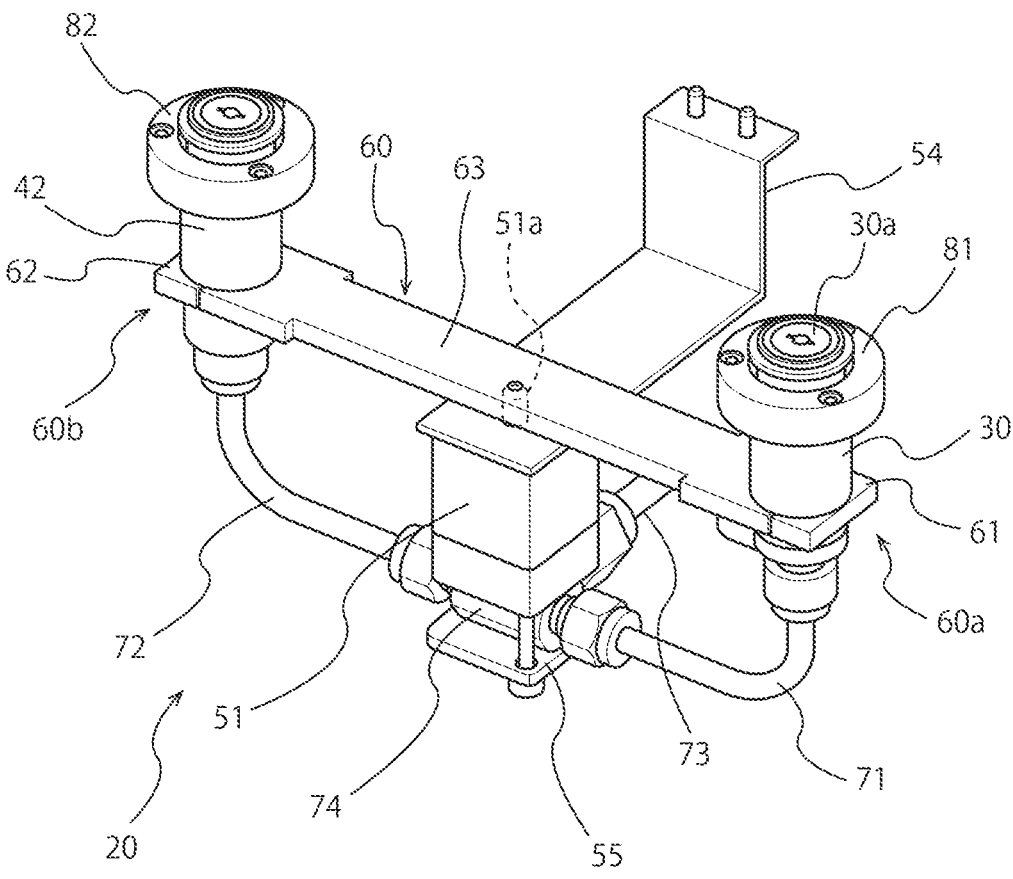
FIG. 5 is a main-part perspective view illustrating a state in which first and second purge nozzles shown in FIG. 3 are in their raised positions.

The first flexible tube portion 71 is connected to the lower end of the first purge nozzle 30 and has flexibility. Since the first flexible tube portion 71 deforms according to a vertical movement of the first purge nozzle 30 described below, the gas passage to the first purge nozzle 30 is secured in both of the lowered position (FIG. 4) and the raised portion (FIG. 5). The first flexible tube portion 71 is not limited as long as it has flexibility. For example, the first flexible tube portion 71 is a resin tube, a metal bellows tube, a knitted tube, or the like.

As with the first flexible tube portion 71, a gas passage is also formed inside the second flexible tube portion 72, and the gas branched at the branching portion 74 flows into the second purge nozzle 42 via the second flexible tube portion 72. The second flexible tube portion 72 is connected to the lower end of the second purge nozzle 42 and has flexibility as with the first flexible tube portion 71. The second flexible tube portion 72 has the same function as the first flexible tube portion 71 except that the second flexible tube portion 72 is connected to the second purge nozzle 42. The material of the second flexible tube portion 72 is the same as that of the first flexible tube portion 71.

In the embodiment shown in FIG. 4 and FIG. 5, the case where gas is introduced from the first purge nozzle 30 and the second purge nozzle 42 into the container 90 is described as an example. In other embodiments, however, gas may be discharged from the container 90 via the first purge nozzle 30 and the second purge nozzle 42. In an embodiment where both of the first purge nozzle 30 and the second purge nozzle 42 discharge gas from the container 90, the gas discharged from both of the first purge nozzle 30 and the second purge nozzle 42 flows into the common gas passage 73. In this case, the common gas passage 73 is connected to an exhaust pipe, an exhaust pump, and the like (not shown).

FIG. 5 is a main-part perspective view illustrating a state in which the first and second purge nozzles 30 and 42 of the gas purge unit 20 are in their raised positions. As shown in FIG. 4 and FIG. 5, the first and second purge nozzles 30 and 42 are vertically moved by the first actuator 51. As shown in FIG. 4, when the first and second purge nozzles 30 and 42 are in their lowered positions, the drive shaft 51a of the first actuator 51 is recessed downward, and the first connection portion 60 connected to the drive shaft 51a is also located lower than the state shown in FIG. 5. Thus, the first purge nozzle 30 and the second purge nozzle 42 held by both ends of the first connection portion 60 are also located at their lowered positions shown in FIG. 4.

FIG. 8 is a schematic cross-sectional view illustrating the first purge nozzle 30 in its lowered position and the first guide ring 81. As shown in FIG. 8, the first guide ring 81 is fixed to the mounting table 80 (see FIG. 3) with a bolt and is not interlocked with a vertical movement of the first purge nozzle 30 with respect to the mounting table 80.

As shown in FIG. 8, the first section 31, which is the uppermost section of the first purge nozzle 30, includes a first-section upper portion 31a and a seal ring 31c. In the first-section upper portion 31a, a top portion 30a (see FIG. 5), which is a part of the first-section upper portion 31a, and the like is exposed on the upper surface side of the mounting table 80 shown in FIG. 2. The first-section upper portion 31a in its lowered position partly protrudes upward from the upper surfaces of the first guide ring 81 and the mounting table 80. Unlike this, however, the whole of the first-section upper portion 31a in its lowered position may be flush with or recessed downward from the upper surfaces of the first guide ring 81 and the mounting table 80.

As shown in FIG. 8, the first section 31 includes a flange portion 31ab protruding outward in the radial direction from the vertically adjacent portions in first-section upper portion 31a. On the other hand, the upper inner periphery of the first guide ring 81 is formed with an upper notch portion 81aa for engaging with the flange portion 31ab. For example, when replacing the first actuator 51, if the first purge nozzle is not supported from below by the first connection portion 60, the movement range of the flange portion 31ab is restricted by the upper notch portion 81aa of the first guide ring 81, which prevents problems, such as the first purge nozzle 30 moving downward more than necessary or falling out of the first guide ring 81.

As shown in FIG. 5, when the first and second purge nozzles 30 and 42 are raised, the drive shaft 51a of the first actuator 51 protrudes upward, and the first connection portion 60 connected to the drive shaft 51a also moves upward more than the state shown in FIG. 4. The first purge nozzle 30 and the second purge nozzle 42 held by both ends of the first connection portion 60 are interlocked with the rises of the drive shaft 51a of the first actuator 51 and the first connection portion 60 and are located in their raised positions shown in FIG. 5.

Figure 9:
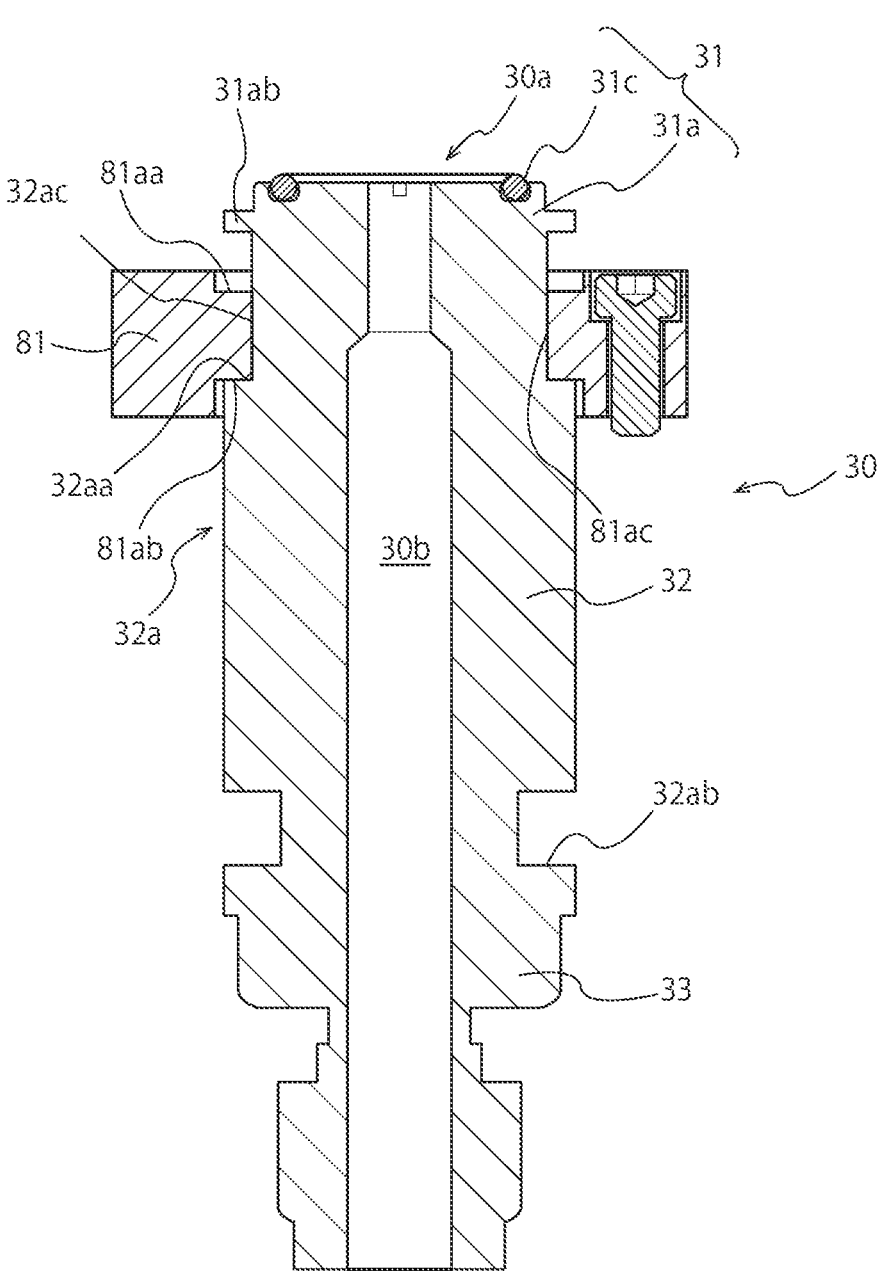
FIG. 9 is a schematic cross-sectional view illustrating the first purge nozzle and a first guide ring in their raised positions.

FIG. 9 is a schematic cross-sectional view illustrating the first purge nozzle 30 in its raised position and the first guide ring 81. As shown in FIG. 9, in the raised position, the first section 31 and the second section 32 of the first purge nozzle 30 are partly located above the upper surfaces of the first guide ring 81 and the mounting table 80. The seal ring 31c provided on the upper surface of the first section 31 contacts with the first purge port 91 (see FIG. 1) of the container 90 and seals the connection portion between the first purge nozzle 30 and the first purge port 91 so as to prevent gas from leaking therefrom.

As shown in FIG. 9, the outer circumferential wall 32a of the second section 32 of the first purge nozzle 30 is formed with a stepped surface 32aa protruding outward in the radial direction from its upper portion. On the other hand, a lower inner periphery 81a of the first guide ring 81 is formed with a lower notch portion 81ab for engaging with the stepped surface 32aa. Since the upward movement range of the stepped surface 32aa is restricted by the lower notch portion 81ab, the first purge nozzle 30 is prevented from moving upward more than necessary. Since the first purge nozzle 30 and the first guide ring 81 form a stopper with the lower notch portion 81ab and the stepped surface 32aa, the tilting of the first purge nozzle 30 can be prevented, and a smooth vertical movement can be achieved.

With respect to the height direction of the first purge nozzle 30, a small diameter portion 32ac located between the flange portion 31ab and the stepped surface 32aa has an outer diameter smaller than that of the flange portion 31ab and the outer circumferential wall 32a below the stepped surface 32aa. The inner diameter of the inner peripheral wall 81ac of the first guide ring 81 is substantially the same as or slightly larger than the outer diameter of the small diameter portion 32ac. The inner peripheral wall 81ac opposes to the small diameter portion 32ac and guides a vertical movement of the small diameter portion 32ac. The second purge nozzle 42 and the second guide ring 82 shown in FIG. 4 and FIG. 5 also have the same shapes as the first purge nozzle 30 and the first guide ring 81 shown in FIG. 8 and FIG. 9.

As shown in FIG. 3, the first purge nozzle 30 and the second purge nozzle 42 are arranged away from the door 98 shown in FIG. 1 with respect to the center of the mounting table 80. On the other hand, the third purge nozzle 43 and the fourth purge nozzle 44 are arranged on the side close to the door 98 shown in FIG. 1 with respect to the center of the mounting table 80.

Figure 6:
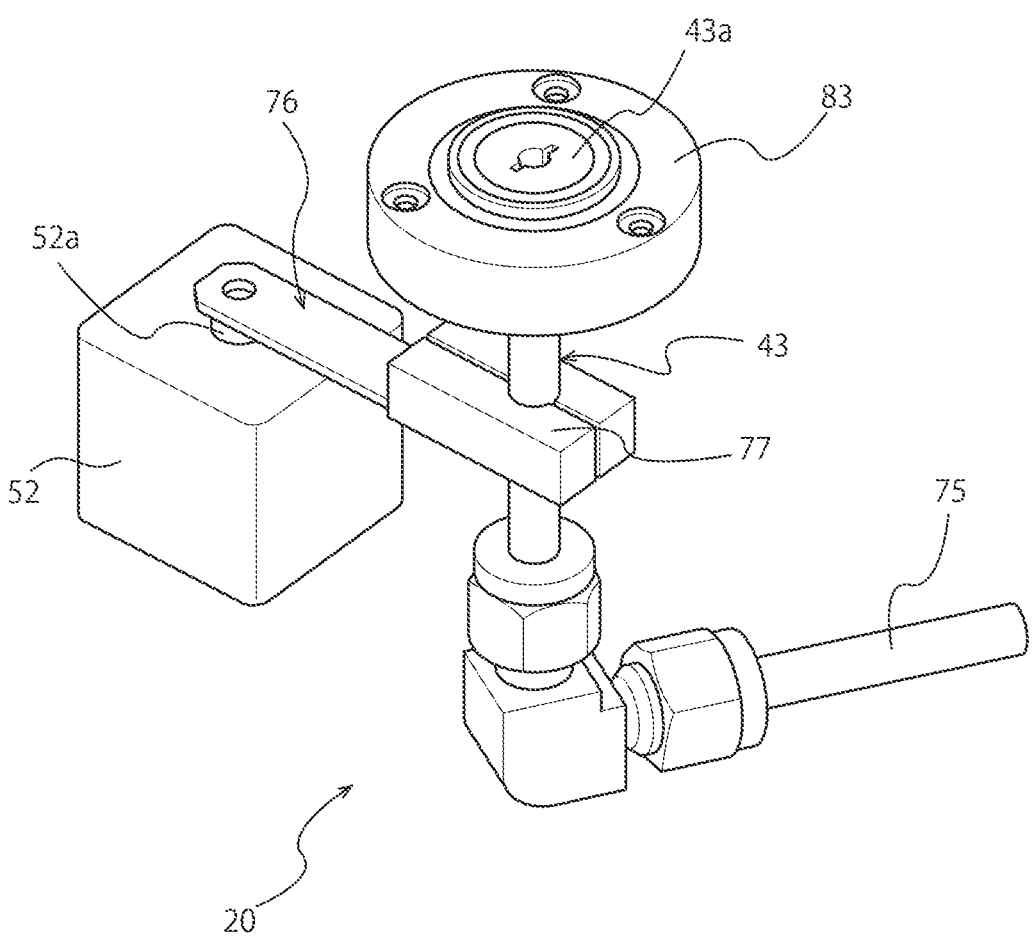
FIG. 6 is a main-part perspective view illustrating a state in which a third purge nozzle shown in FIG. 3 is in its lowered position.

FIG. 6 is a main-part perspective view illustrating a state in which the third purge nozzle 43 shown in FIG. 3 is in its lowered position. As shown in FIG. 6, in the raised position shown in FIG. 6, the third purge nozzle 43 of the gas purge unit 20 communicates with the third purge port 93 (FIG. 1) of the container 90 and discharges gas from the container 90. However, the third purge port 93 may be capable of introducing gas into the container 90 and may be capable of switching the introduction of gas and the discharge of gas.

As shown in FIG. 6, the gas purge unit 20 includes a second connection portion 76, a second actuator 52, a third flexible tube portion 75, and the like. Although not shown in FIG. 6, the second actuator 52 is fixed to the mounting table 80 via a bracket connected above the second actuator 52. A third guide ring 83 through which the third purge nozzle 43 is inserted is fixed to the mounting table 80 and is not interlocked with a vertical movement of the third purge nozzle 43.

As with the first actuator 51 shown in FIG. 4, the second actuator 52 includes a drive shaft 52a that moves vertically. However, the second actuator 52 is not limited to only the one shown in FIG. 4. As with the first actuator 51, an actuator having a transmission means other than the drive shaft 52a may be employed for the second actuator 52.

The second connection portion 76 includes a third holding portion 77 for holding the third purge nozzle 43. The third holding portion 77 is disposed at one end of the second connection portion 76, and the other end of the second connection portion 76 is connected to the drive shaft 52a of the second actuator 52. In such a structure, the second actuator 52 vertically moves the second connection portion 76 and the third purge nozzle 43. The third holding portion 77 sandwiches and holds the third purge nozzle 43.

Figure 7:
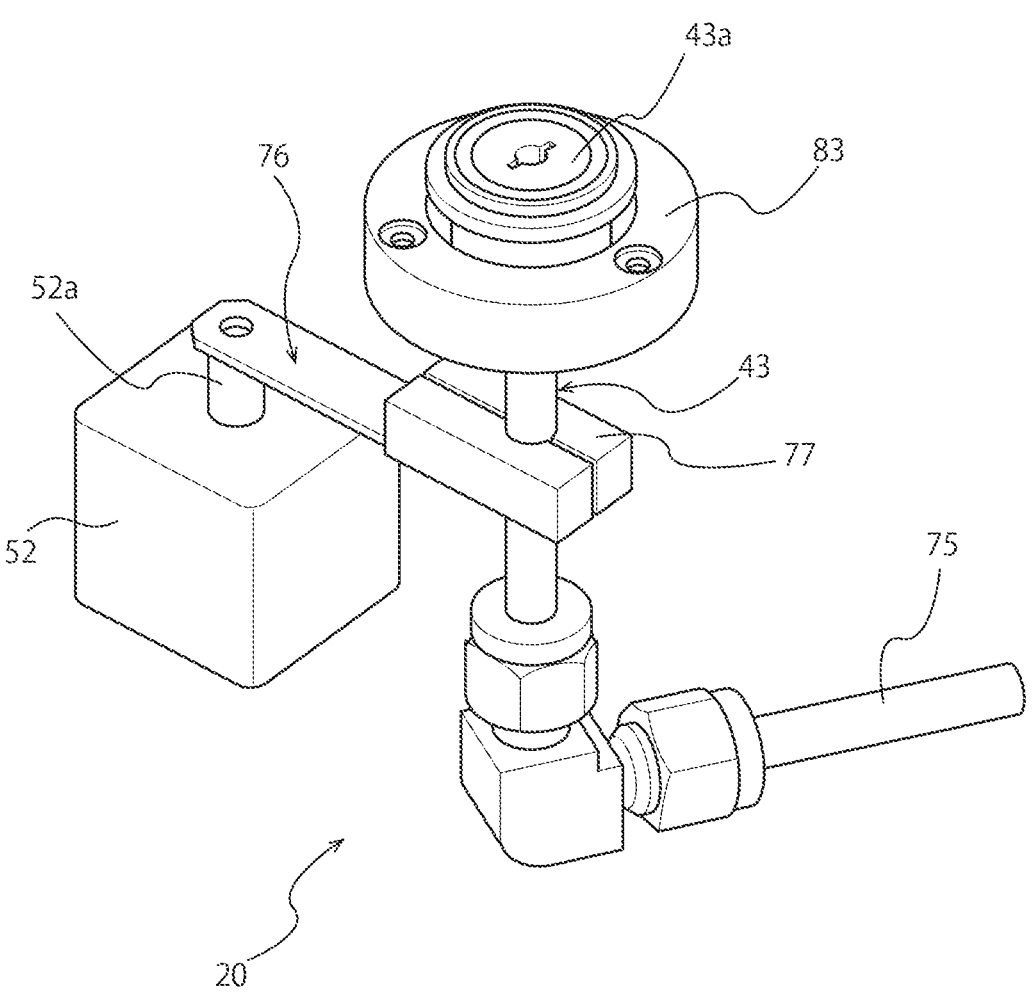
FIG. 7 is a main-part perspective view illustrating a state in which a third purge nozzle shown in FIG. 3 is in its raised position.

FIG. 7 is a main-part perspective view illustrating a state in which the third purge nozzle 43 of the gas purge unit 20 is in its raised position. As shown in FIG. 6 and FIG. 7, the third purge nozzle 43 can be vertically moved by the second actuator 52 in an independent manner of the first and second purge nozzles. As shown in FIG. 6, when the third purge nozzle 43 is in its lowered position, the drive shaft 52a of the second actuator 52 is recessed downward, and the second connection portion 76 connected to the drive shaft 52a is also located lower than the state shown in FIG. 7. Thus, the third purge nozzle 43 held by the second connection portion 76 is also located in the lowered position shown in FIG. 6.

As shown in FIG. 7, when the third purge nozzle 43 is raised, the drive shaft 52a of the second actuator 52 protrudes upward, and the second connection portion 76 connected to the drive shaft 52a also moves upward more than the state shown in FIG. 6. The third purge nozzle 43 held by the second connection portion 76 is also interlocked with the rises of the drive shaft 52a of the second actuator 52 and the second connection portion 76 and is located in the raised position shown in FIG. 7.

In the raised position, a top portion 43a of the third purge nozzle 43 protrudes upward from the upper surfaces of the third guide ring 83 and the mounting table 80, and the third purge nozzle 43 is connected to the third purge port 93 of the container 90. As shown in FIG. 6 and FIG. 7, a third flexible tube portion 75 is connected to the lower end of the third purge nozzle 43 and can deform according to a vertical movement of the third purge nozzle 43. The material and the like of the third flexible tube portion 75 is not limited and may be the same as those of the first and second flexible tube portions 71 and 72, for example.

A gas passage is formed inside the third flexible tube portion 75, and the gas discharged from the container 90 and passed through the third purge nozzle 43 can flow into the third flexible tube portion 75. Preferably, the end of the third flexible tube portion 75 opposite to the third purge nozzle 43 is connected to a space having a pressure lower than that of the container 90, such as a gas passage and a discharge pump.

The mechanism for vertically moving the fourth purge nozzle 44 shown in FIG. 3 is the same as the mechanism for vertically moving the third purge nozzle 43 shown in FIG. 6 and FIG. 7 and is not thus described. The fourth purge nozzle 44 is also connected to a fourth purge port of the container 90 and can introduce gas into the container 90. As with the third purge nozzle 43, however, the fourth purge nozzle 44 may be able to discharge gas from the container 90.

The gas purge unit 20 shown in FIG. 3 introduces gas into the container 90 using the first and second purge nozzles 30 and 42 vertically movable by the first actuator 51. Gas is discharged from the container 90 using the third purge nozzle 43 vertically movable by the second actuator 52. In the gas purge unit 20, the first and second purge nozzles 30 and 42 for introducing gas and the third purge nozzle 43 for discharging gas can operate independently. Thus, when performing only gas introduction or gas discharge, unused purge ports at this time can be closed to perform an efficient purging.

As purge nozzles for introducing gas into the container 90, the gas purge unit includes not only the first and second purge nozzles 30 and 42, but also the fourth purge nozzle 44 that is vertically moved by a third actuator 53. The gas purge unit 20 switches connection and disconnection between the fourth purge nozzle 44 and the fourth purge port and can thereby change the direction and speed of gas flow in the container 90 or the speed of purging and more uniformly purge the inside of the container 90.

The gas introduced into the container 90 from the first, second, and fourth purge nozzles 30, 42, and 44 is not limited and is, for example, a dry air (CDA) or an inert gas, but is preferably nitrogen gas.

In the gas purge unit 20 shown in FIG. 3, the purge nozzles 30, 42, 43, and 44 and the actuators 51 and 52 are connected by the connection portions 60 and 76, the purge nozzles 30, 42, 43, and 44 and the actuators 51 and 52 are separated. In such a gas purge unit 20, it is not necessary to disassemble the nozzles at the time of repair or failure of the actuators 51 and 52, and maintainability is excellent.

Since the gas purge unit 20 operates two purge nozzles 30 and 42 by one first actuator 51, the operations of the two purge nozzles 30 and 42 can be easily synchronized, and it is possible to prevent a connection failure between the purge nozzles 30 and 42 and the purge port 91. In addition, it is possible to prevent variations in the operation of each nozzle, which is a problem with conventional piston-type purge nozzles of air cylinders. Moreover, since the two purge nozzles 30 and 42 are operated by one first actuator 51, the number of parts can be reduced, and assemblability and maintainability are excellent in this respect as well.

Since the gas purge unit 20 includes the common gas passage 73 for gas introduction, the gas passage is simplified, and maintainability is excellent. In addition, since the total length of the gas passages included in the entire gas purge unit 20 can be reduced, the number of parts can be reduced, and assemblability and maintainability are improved. In addition, since gas can be introduced or discharged by a plurality of nozzles, gas can be efficiently purged in the container.

Hereinabove, the present invention is described with reference to an embodiment, but the present invention is not limited to the above-described embodiment. Needless to say, many other embodiments and modifications are included in the technical scope of the present invention. For example, the number of actuators included in the gas purge unit 20 is not limited to only three. The purge nozzles and actuators may correspond one-to-one, and one actuator vertically may move three or more purge nozzles.

EXPLANATION OF REFERENCES

10 . . . load port device
20 . . . gas purge unit
30 . . . first purge nozzle
30*a* . . . top portion
30*b* . . . passage
31 . . . first section
31*a* . . . first-section upper portion
31*c* . . . seal ring
31*ab* . . . flange portion
32 . . . second section
32*a* . . . outer circumferential wall
32*aa* . . . stepped surface
32*ab* . . . communication groove
33 . . . third section
42 . . . second purge nozzle
43 . . . third purge nozzle
44 . . . fourth purge nozzle
43*a* . . . top portion
51 . . . first actuator
51*a* . . . drive shaft
52 . . . second actuator
52*a* . . . drive shaft
53 . . . third actuator
54 . . . bracket
55 . . . support portion
60 . . . first connection portion
60*a* . . . one end
61 . . . first holding portion
60*b* . . . the other end
62 . . . second holding portion
63 . . . arm portion
71 . . . first flexible tube portion
72 . . . second flexible tube portion
73 . . . common gas passage
74 . . . branching portion
75 . . . third flexible tube portion
76 . . . second connection portion
77 . . . third holding portion
80 . . . mounting table
81 . . . first guide ring
81*a* . . . lower inner periphery
81*aa* . . . upper notch portion
81*ab* . . . lower notch portion
82 . . . second guide ring
83 . . . third guide ring
84 . . . fourth guide ring
85 . . . positioning pin
86 . . . fixation mechanism
87 . . . mounting sensor
88 . . . through hole
90 . . . container
90*a* . . . bottom portion
91 . . . first purge port
93 . . . third purge port
94 . . . lid
96 . . . substrate
97 . . . EFEM
98 . . . door
99 . . . substrate transfer chamber

The invention claimed is:

1. A gas purge unit comprising:
a plurality of purge nozzles each including a gas passage formed therein and being capable of communicating with a respective one of a plurality of purge ports provided at a bottom of a container so as to introduce gas into the container or discharge gas from the container;
a plurality of actuators; and
a plurality of connection portions that each connect one or more of the purge nozzles to an actuator among the plurality of actuators, wherein:
each actuator moves the connected one or more of the purge nozzles in a vertical direction,
each connection portion separates the connected one or more of the purge nozzles from the one of the actuators in a horizontal direction,
the plurality of purge nozzles are configured to all be simultaneously positioned beneath the bottom of the container, and
each actuator is movable independently of another actuator among the plurality of actuators, such that a first one or more of the purge nozzles can be connected to a respective one or more of the purge ports while a second one or more of the purge nozzles is separated from the bottom of the container.

2. The gas purge unit according to claim 1, wherein:
the plurality of purge nozzles comprises a first purge nozzle and a second purge nozzle;
the plurality of connection portions includes a first connection portion that comprises:
a first holding portion for holding the first purge nozzle at one end of the first connection portion;
a second holding portion for holding the second purge nozzle at another end of the second holding portion; and
an arm portion for connecting the first holding portion and the second holding portion,
the first connection portion is connected to a first actuator among the plurality of actuators via the arm portion, and
the first actuator vertically moves the first connection portion, the first purge nozzle, and the second purge nozzle.

3. The gas purge unit according to claim 2, further comprising a common gas passage for supplying gas to both of the first purge nozzle and the second purge nozzle or for receiving gas discharged from both of the first purge nozzle and the second purge nozzle,
wherein both of the first purge nozzle and the second purge nozzle introduce gas to the container or discharge gas from the container.

4. The gas purge unit according to claim 3, wherein a branching portion with a branching passage from the common gas passage to the first purge nozzle and the second purge nozzle is disposed closer to the first actuator than the first and second purge nozzles.

5. The gas purge unit according to claim 1, further comprising a flexible tube portion including a gas passage formed therein and connected to a lower end of the first purge nozzle,
wherein the flexible tube portion deforms according to a vertical movement of the first purge nozzle.

6. The gas purge unit according claim 2, wherein:
the plurality of purge nozzles further comprises a third purge nozzle;

the plurality of connection portions further includes a second connection portion including a third holding portion for holding the third purge nozzle at one end of the second connection portion; and a second actuator among the plurality of actuators is connected with the second connection portion and vertically moves the second connection portion and the third purge nozzle.

7. The gas purge unit according to claim 6, configured such that:

the first purge nozzle vertically movable by the first actuator introduces gas into the container, at the same time that the third purge nozzle vertically movable by the second actuator discharges gas from the container.

8. A load port device comprising:

a gas purge unit comprising:

a first purge nozzle including a gas passage formed therein and being capable of communicating with a first purge port provided at a bottom of a container so as to introduce gas into the container or discharge gas from the container;

a first connection portion including a first holding portion for holding the first purge nozzle at one end of the first connection portion; and a first actuator connected with the first connection portion so as to vertically move the first connection portion and the first purge nozzle; and a mounting table capable of mounting the container and provided with the gas purge unit, wherein a first guide ring, through which the first purge nozzle is inserted, is fixed to the mounting table, and a notch portion for restricting a rise of a stepped surface formed on an outer circumferential wall of the first purge nozzle is formed at a lower inner periphery of the first guide ring.

9. A load port device comprising:

the gas purge unit according to claim 1; and a mounting table capable of mounting the container and provided with the gas purge unit, wherein a first guide ring, through which the first purge nozzle is inserted, is fixed to the mounting table, and a notch portion for restricting a rise of a stepped surface formed on an outer circumferential wall of the first purge nozzle is formed at a lower inner periphery of the first guide ring.

10. The gas purge unit according to claim 6, wherein the third purge valve is configured to switch between introducing gas into the container and discharging gas from the container.

* * * * *